(12) United States Patent
Parsey, Jr. et al.

(10) Patent No.: US 10,068,791 B2
(45) Date of Patent: Sep. 4, 2018

(54) WAFER SUSCEPTOR FOR FORMING A SEMICONDUCTOR DEVICE AND METHOD THEREFOR

(71) Applicant: SEMICONDUCTOR COMPONENTS INDUSTRIES, LLC, Phoenix, AZ (US)

(72) Inventors: John Michael Parsey, Jr., Phoenix, AZ (US); Hocine-Bouzid Ziad, Kortrijk (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 660 days.

(21) Appl. No.: 13/791,007

(22) Filed: Mar. 8, 2013

(65) Prior Publication Data
US 2014/0251542 A1    Sep. 11, 2014

(51) Int. Cl.
*H01L 21/673* (2006.01)
*H01L 21/687* (2006.01)

(52) U.S. Cl.
CPC .... *H01L 21/6875* (2013.01); *H01L 21/68735* (2013.01)

(58) Field of Classification Search
USPC ..................... 156/345.51; 118/728
See application file for complete search history.

(56) References Cited

U.S. PATENT DOCUMENTS

| 6,086,680 A | 7/2000 | Foster et al. | |
| 7,198,677 B2* | 4/2007 | Yoo | C23C 16/0236 118/715 |
| 7,488,400 B2* | 2/2009 | Koyata | H01L 21/67075 134/153 |
| 2003/0049580 A1* | 3/2003 | Goodman | C23C 16/4581 432/258 |
| 2005/0193952 A1* | 9/2005 | Goodman | H01J 37/32871 118/728 |
| 2005/0284372 A1* | 12/2005 | Murugesh | C23C 16/4404 118/715 |
| 2011/0049779 A1* | 3/2011 | Egami | C23C 16/4583 269/289 R |
| 2013/0109192 A1* | 5/2013 | Hawkins | C23C 16/45521 438/758 |
| 2014/0084529 A1* | 3/2014 | Kim | H01L 21/68735 269/287 |
| 2014/0251542 A1* | 9/2014 | Parsey, Jr. | H01L 21/68735 156/345.51 |

OTHER PUBLICATIONS

R. Pagliaro, Jr. et al., "Uniformly Thick Selective Epitaxial Silicon", J. Electrochemical Soc.: Solid-State Science and Technology, May 1987, vol. 134 No. 5, pp. 1235-1238.

John Ogawa Borland, Novel Device Structures by Selective Epitaxial Growth (SEG), invited paper, IEDM 1987, 12-IEDM 87-IEDM 87-15.

* cited by examiner

*Primary Examiner* — Sylvia MacArthur
(74) *Attorney, Agent, or Firm* — Robert F. Hightower

(57) ABSTRACT

In one embodiment, a wafer susceptor is formed to have portion of the susceptor that is positioned between a wafer pocket and an outside edge of the susceptor to have a non-uniform and/or a non-planar surface. In another embodiment, the non-uniform and/or non-planar surface includes one of a recess into the surface or a protrusion extending away from the surface.

16 Claims, 6 Drawing Sheets

US 10,068,791 B2

WAFER SUSCEPTOR FOR FORMING A SEMICONDUCTOR DEVICE AND METHOD THEREFOR

BACKGROUND OF THE INVENTION

The present invention relates, in general, to semiconductors, and more particularly, to methods of forming semiconductor devices and equipment for manufacturing semiconductor wafers and devices.

In the past, the semiconductor industry utilized various methods and equipment for manufacturing semiconductor wafers, such as manufacturing circuits on a semiconductor wafer. For some manufacturing operations, the wafer was placed in a reactor or high-temperature oven to perform some of the manufacturing operation(s). Typically, the semiconductor wafer was placed on a wafer support or wafer carrier, often referred to as a wafer susceptor or susceptor. The semiconductor wafer typically was placed on the susceptor and the susceptor was placed inside the reactor to perform operations such as chemical vapor deposition (CVD) or reactive ion etching (RIE) or epitaxial layer formation or other manufacturing procedures.

Often during the manufacturing operation, defects were formed on certain areas of the semiconductor wafer. These defects reduced the number of good usable die on the semiconductor wafer. Such defects increase the manufacturing cost and reduced the reliability of the semiconductor devices.

Accordingly, it is desirable to have equipment and methods for processing semiconductor wafers and devices that assist in reducing defects on a semiconductor wafer, that assist in increasing the yield of good die from the semiconductor wafer, and that assists in reducing manufacturing cost.

For simplicity and clarity of the illustration(s), elements in the figures are not necessarily to scale, and the same reference numbers in different figures denote the same elements, unless stated otherwise. The drawings described herein are only schematic and are non-limiting. The dimensions and the relative dimensions do not correspond to actual reductions to practice of the invention. Additionally, descriptions and details of well-known steps and elements are omitted for simplicity of the description. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there may be minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

DETAILED DESCRIPTION OF THE DRAWINGS

As will be seen further hereinafter, the present description includes, among other features, a wafer susceptor formed to have non-uniform surface, such as non-uniform height across the surface, and/or a non-planar surface for a portion of the susceptor that is between a wafer pocket of the susceptor and an outside edge of the susceptor.

Figure 1:
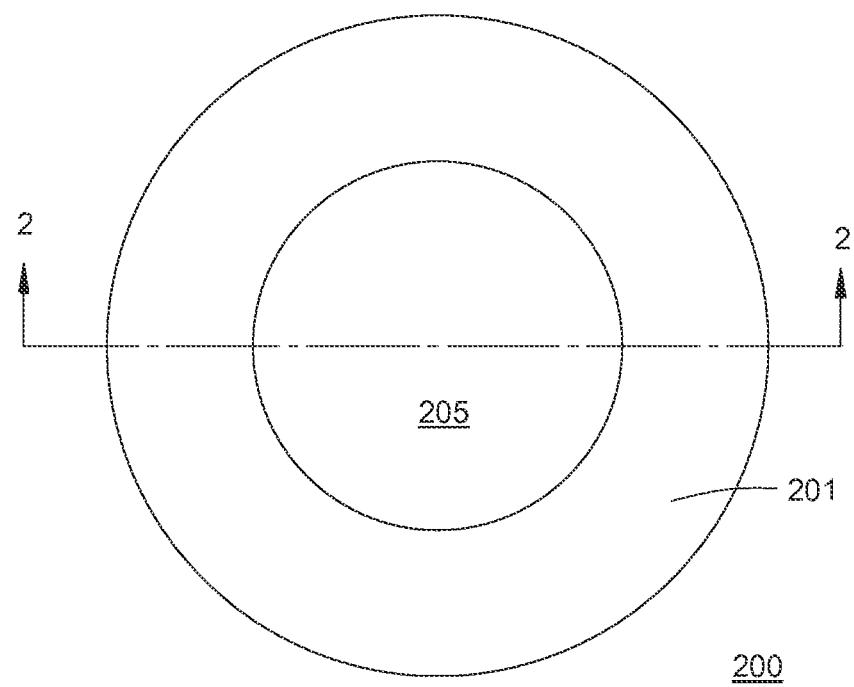
FIG. 1 illustrates an example of a plan view of a related art susceptor.

FIG. 1 illustrates a reduced plan view of a related art wafer susceptor 200.

Figure 2:
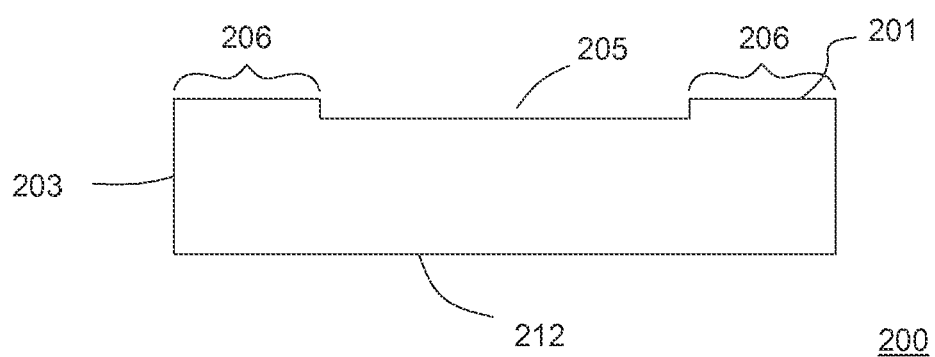
FIG. 2 illustrates a cross-sectional view of the susceptor of FIG. 1.

FIG. 2 illustrates a reduced cross-sectional view of susceptor 200 along cross-section line 2-2. This description has references to FIG. 1 and FIG. 2. Susceptor 200 typically was a disk shaped material having a top surface 201, an outer edge 203, and a bottom surface 202. A wafer recess or wafer pocket 205 typically was formed in the top surface 201 in order to form a place to hold a semiconductor wafer during operations to form circuits on the semiconductor wafer. A portion 206 of the top surface typically was between pocket 205 and an outside edge 203 of susceptor 200. Surface 201 of portion 206 typically was flat in order to allow gases to flow across the susceptor to the wafer that was inserted into pocket 205.

Turning now away from the related art, it has been found, that during some manufacturing processes, defects could form on a semiconductor wafer. It has been found that these defects often were more prevalent on the outside edges of a semiconductor wafer than on the interior portions of the wafer. For example, if the device formed on the semiconductor wafer had trenches formed in the wafer it was possible that during oxidation or epitaxial formation or other procedures, the top portion of the trenches may be closed on trenches positioned near the outside edges of the wafer but not be closed on trenches in the interior of the wafer. The closed trenches represent defects that reduce the yield of good devices from the semiconductor wafer. It is believed that these outer defects were influenced by an increased growth rate near the outermost portions of the wafer.

Figure 3:
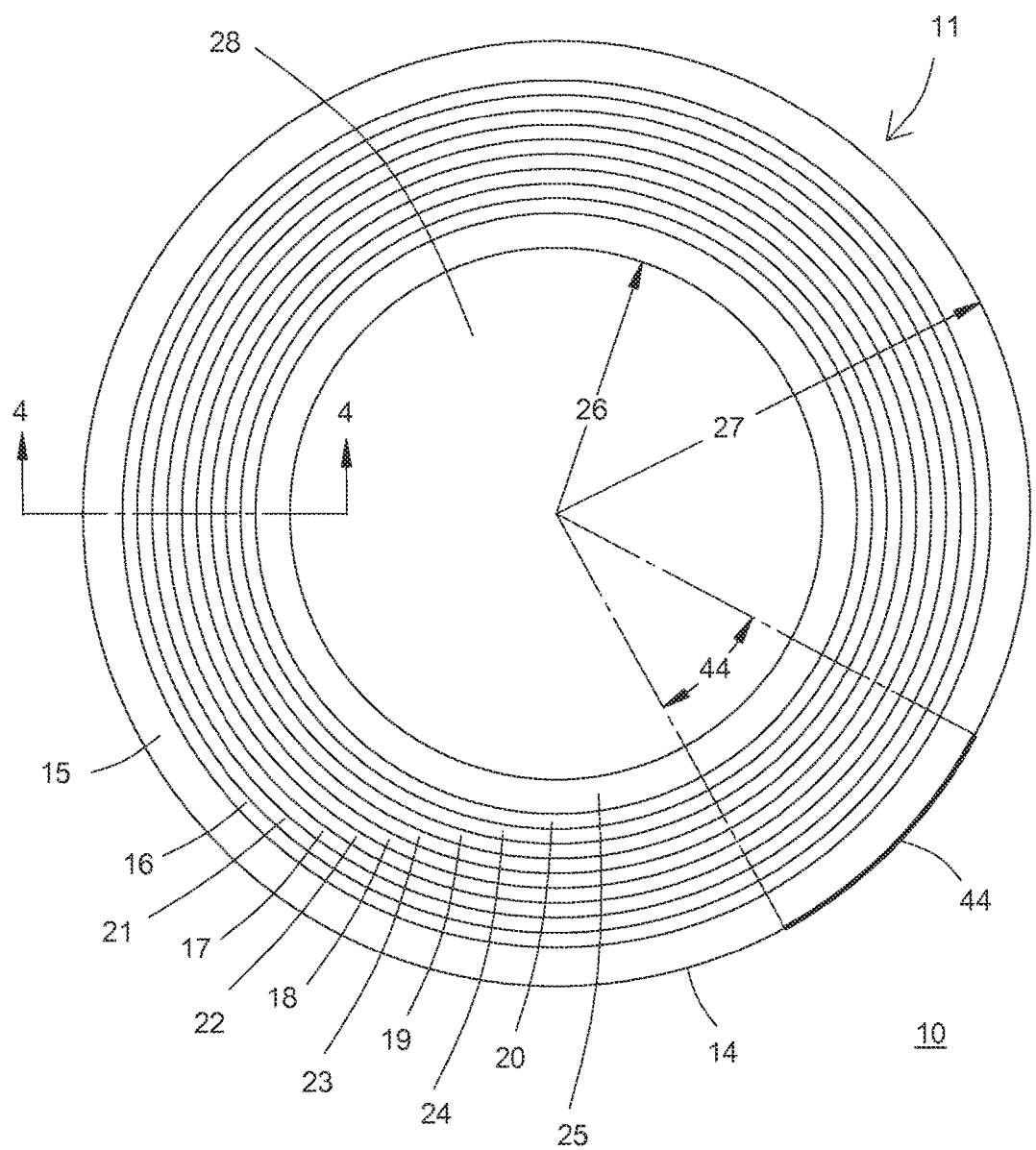
FIG. 3 illustrates a reduced plan view of an example of a portion of an embodiment of a susceptor in accordance with the present invention.

FIG. 3 illustrates a reduced plan view of an example of a portion of an embodiment of a wafer susceptor or susceptor 10 that assists in reducing defects formed on a semiconductor wafer, that assists in improving the yield of good die from the semiconductor wafer, and that assists in reducing manufacturing cost.

Figure 4:
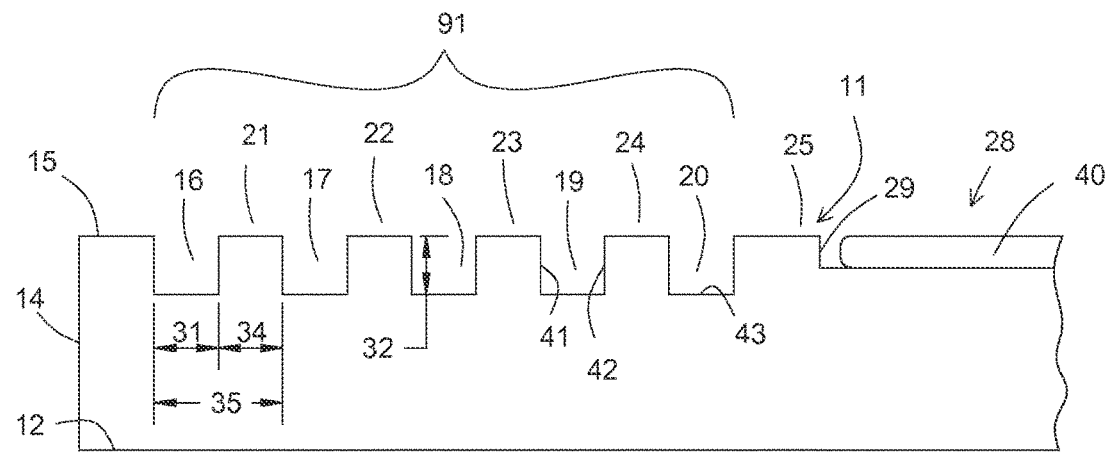
FIG. 4 illustrated a reduced cross-sectional view of an example of a portion of the susceptor of FIG. 3 in accordance with the present invention.

FIG. 4 illustrates a cross-sectional view of susceptor 10 along cross-section line 4-4. This description has references to FIG. 3 and FIG. 4. Susceptor 10 has a first surface, for example a top surface 11 illustrated in a general manner by an arrow. A wafer pocket 28 is used to hold a semiconductor wafer during manufacturing operations, the semiconductor wafer is illustrated in a general manner by a wafer 40. Pocket 28 generally is formed as an opening extending into a central portion of susceptor 10. Typically, susceptor 10 is round and has an outside edge 14 along the outer perimeter of susceptor 10. Susceptor 10 may have other geometric shapes in other embodiments. Susceptor 10 has a radius 27 (FIG. 3) that is larger than a radius 26 of pocket 28.

Susceptor 10 also includes a flow control structure 91 (FIG. 4) that assists in forming more uniform structures on a semiconductor wafer such as wafer 40. Flow control structure 91 includes a plurality of recesses 16-20 formed on surface 11 and extending into the material of susceptor 10. Recesses 16-20 generally extend toward a second surface, for example a back surface 12, of susceptor 10. Recesses 16-20 typically are formed in a portion of surface 11 that is between an outside edge 29 of pocket 28 and outside edge 14 of susceptor 10. Recesses 16-20 have a depth 32 from surface 11 and a width 31 across surface 11. This forms recesses 16-20 with sidewalls 41 and 42 and a bottom 43. Recesses 16-20 generally are spaced apart a distance or spacing 35 such that respective spaces 21-24 are formed between adjacent recesses. Spaces 21-24 typically have a width 34 which forms a corresponding distance between adjacent ones of recesses 16-20. An outer ledge 15 typically is formed between the outermost recess, such as recess 16, and outside edge 14. Ledge 15 generally has a top surface that is coplanar to surface 11. Ledge 15 may have width 34 or may be a different width. An inner ledge 25 of susceptor 10 generally is positioned between pocket 28 and the innermost recess, such as recess 20, and may have width 34 or may have a different width. In most embodiments, but not necessarily all, ledge 15 and ledge 25 is not a portion of structure 91. In some embodiments, the outermost recess may overlap edge 14 which may result in a step along edge 14.

Typically, gases used during the manufacturing process flow across susceptor 10 in a direction from outside edge 14 toward wafer pocket 28. In some operations, there may be higher reactivity between the gases and the outside portion of wafer 40, such as the portion that is closer to edge 29, than for portions of wafer 40 that are closer to the center of pocket 28. It is believed that the flow control structure modifies the local gas flow dynamics and/or the streamlines of the gas flow across the outside portion of susceptor 10 which results in modifying the interaction between the gas and portions of wafer 40 around the outside edges of wafer 40. For example, the flow control structure may cause turbulence in the gas stream which may change the effective thickness of the gas diffusion flow at the boundary region of the outer edge of wafer 40. The flow control structure results in a more homogeneous reaction between the gas and the material of wafer 40 across approximately at least a portion of the width of wafer 40 and in some embodiments across the full width of wafer 40. The action range of the flow control structure above the wafer edge depends on the flow control structure design, and may vary from a few millimeters inside the outer edge of the wafer (such as for low efficiency), up to the full area of the wafer surface (such as for high efficiency). It is also possible that the flow control structure may deplete some species from the gas flow to slow or reduce the reaction between the gas and the portion of the material of wafer 40 that is closer to the flow control structure. The area of sidewalls 41-42 increases the effective surface area of the portion of susceptor 10 that is positioned between edge 14 and an edge 29 of pocket 28 versus the surface area of a susceptor that does not have recesses 16-20. It is believed that this increased surface area may affect the rate of reaction between the gases and the material along the outside edge of the semiconductor wafer. In one example embodiment, flow control structure 91 increased the device yield from a semiconductor wafer by ten to fifteen percent (10%-15%).

In another example application, trenches were formed in various locations on a semiconductor wafer. An epitaxial layer was formed to uniformly fill the trenches. The process was performed at a pressure of approximately ten to thirty (10-30) Torr. Susceptor 10 was formed so that sidewalls 41-42, bottom 43, and surface 11 of spaces 21-24 and of ledges 15 and 25 resulted in a surface area that was approximately two and one-half to four (2.5-4) times the surface area that a same sized susceptor would have without recesses 16-20. For this example embodiment, spacing 35 was approximately one and four tenths (1.4) millimeters, width 31 was approximately seven tenths (0.7) of a millimeter, and depth 32 was approximately two (2) millimeters. The yield from the semiconductor wafer was improved by approximately fifteen to twenty-five percent (15%-25%). In other embodiments, width 34, spacing 35, and depth 32 may have other values. For example, depth 32 may be between approximately one to five (1-5) millimeters and width 34 may be between approximately 0.1 and 1.0 millimeters.

Those skilled in the art will understand that structure 91 may have various alternate embodiments. Although structure 91 is illustrated with five recesses, the number of recesses may be more or less than five. Typically, the number of recesses and the depth of the recesses are configured to provide a desired surface area for the flow control structure. The desired surface area may vary depending on the reactor pressure, flow rate of the gases, and the species of the gases. Additionally, any of or all of recesses 16-20 may have different shapes instead of the trench type shape illustrated in FIG. 4. For example, the recess may have a triangular shape or may have a flared shape where one of the top or the bottom of the opening of the recess may have a width that is larger than the other of the top or bottom of the recess. For example, the distance across the bottom of the opening of recess 20 may be wider than the distance across the top of the opening.

In some manufacturing operations, susceptor 10 rotates within the reactor. For these operations, the embodiment of structure 91 may be formed to have a multiply-connected topography that extends concentrically around susceptor 10. The term "multiply-connected" means a connected domain that has a hole or multiple holes in it. One example of a multiply-connected topography is a doughnut. The multiply-connected topography would correspond to the geometric shape of susceptor 10. For example, pocket 28 may be located in the hole of the multiply-connected topography of structure 91. In other embodiments, structure 91 may be formed in an open geometric pattern that does not enclose pocket 28. Structure 91 may be formed as one short segment or a plurality of discontinuous sections. For example, structure 91 formed in the shape of an arc, such as arc 44 illustrated in FIG. 3, or in several arcs that do not intersect. An open geometric shape may be useful for operations in which susceptor 10 does not rotate.

One skilled in the art can understand from the above that the flow control structure forms a non-uniform surface on a portion of susceptor 10 that is positioned between pocket 28, and particularly between edge 29 of pocket 28, and edge 14 of susceptor 10.

Susceptor 10 generally is made of a material suitable for and compatible with manufacturing circuits on semiconductor material. In some embodiments, the material used for susceptor 10 may be graphite, quartz, or other suitable material. Structure 91 is formed in the material of susceptor 10. Subsequently, a protective material, such as silicon carbide or other material, may be used to cover at least a portion of the material of susceptor 10 including structure 91.

Figure 5:
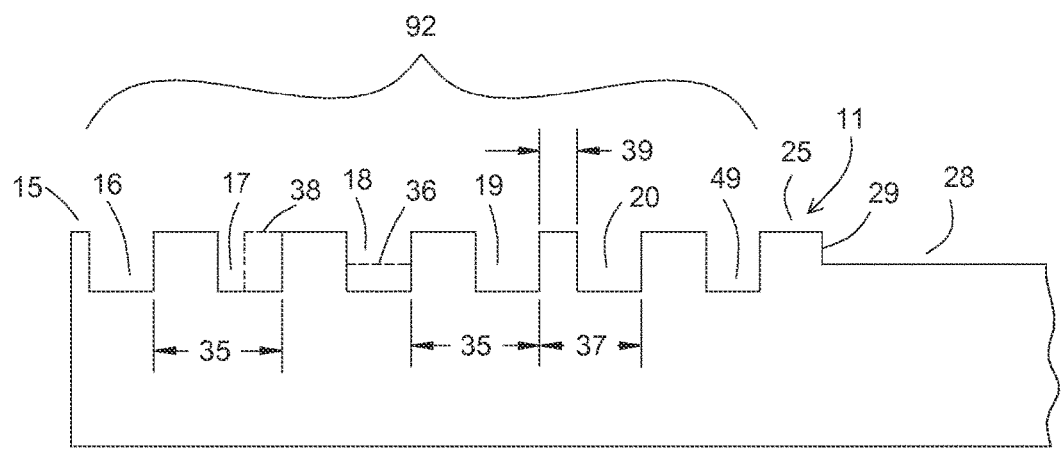
FIG. 5 illustrated a reduced cross-sectional view of an example of a portion an embodiment of a susceptor that is an alternate embodiment of the susceptor of FIG. 3 in accordance with the present invention.

FIG. 5 illustrates a cross-sectional view of an example of a portion of an embodiment of a susceptor 45 that is an alternate embodiment of susceptor 10. Susceptor 45 is similar to susceptor but includes a flow control structure 92 that is an alternate embodiment of flow control structure 91 that was described in the description of FIGS. 3-4. Structure 92 is similar to structure 91, however, the spacing between recesses 16-20 may be the same as spacing 35 or may be different such as a spacing 37 illustrated between recesses 18 and 19. Additionally, structure 92 may include an optional additional recess 49. In other embodiments, structure 92 may include other differences. For example, the width of any one or all of recesses 16-20 and 49 may be different than width 31 as illustrated by dashed line 38. Furthermore, the depth of one or all of recesses 16-20 and 49 may be different than depth 32 has illustrated by a dashed line 36. Additionally, each recess may have a different depth from other recesses of structure 92.

Figure 6:
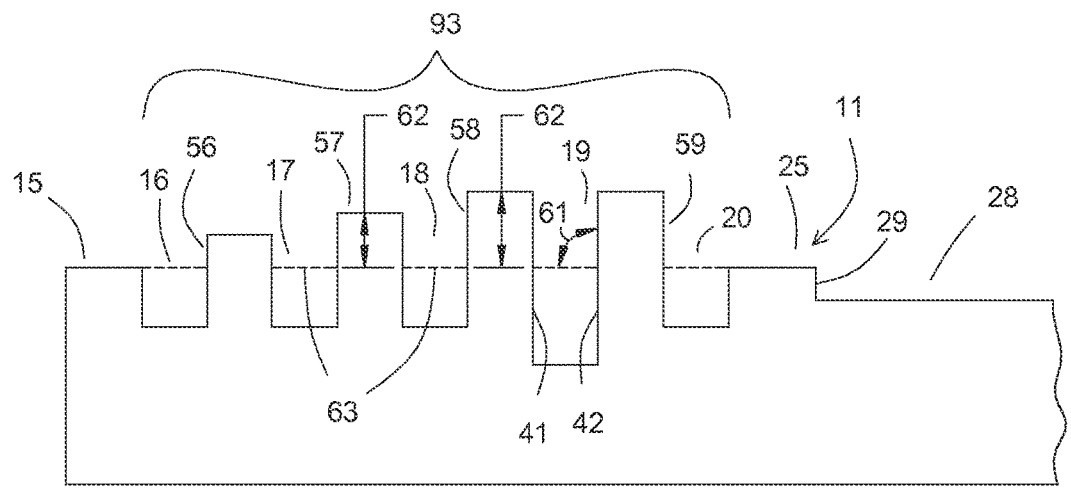
FIG. 6 illustrated a reduced cross-sectional view of an example of a portion an embodiment of another susceptor that is an alternate embodiment of the susceptor of FIG. 3 in accordance with the present invention.

FIG. 6 illustrates a cross-sectional view of an example of a portion of an embodiment of a wafer susceptor 55 that is an alternate embodiment of susceptors 10 and 45. Susceptor 55 includes a flow control structure 93 that is an alternate embodiment of structures 91 and/or 92. Structure 93 is similar to structures 91 and 92 except that structure 93 includes a plurality of protrusions 56-59 that are positioned in between respective recesses 16-20. Protrusions 56-59 extend away from surface 11 at an angle 61 to surface 11. Although angle 61 is illustrated as a 90° angle, angle 61 may have various other angles. For the embodiment illustrated in FIG. 6, protrusions 56-59 all extend a height or distance 62 away from surface 11 so that the value of distance 62 varies such as increasing with decreasing distance from pocket 28. In other embodiments, distant 62 may be the same for all of protrusions 56-59. In another embodiment, the number of protrusions 56-59 may be less or may be greater than the four (4) illustrated in FIG. 6. For example there may not be a protrusion between one of or all of recesses 16-20. In another embodiment, there may be an additional protrusion along outer ledge 15 and/or inner ledge 25. In another embodiment, one of or all of recesses 16-20 may be omitted as illustrated by a dashed line 63.

Additionally, any of or all of protrusions 56-59 may have different shapes instead of the rectangular cross-section type shape illustrated in FIG. 6. For example, the protrusion may have a triangular shape where the cross-sectional width decreases or increases with distance away from surface 11. As can be seen, structure 93 is formed to have a variable height.

Figure 7:
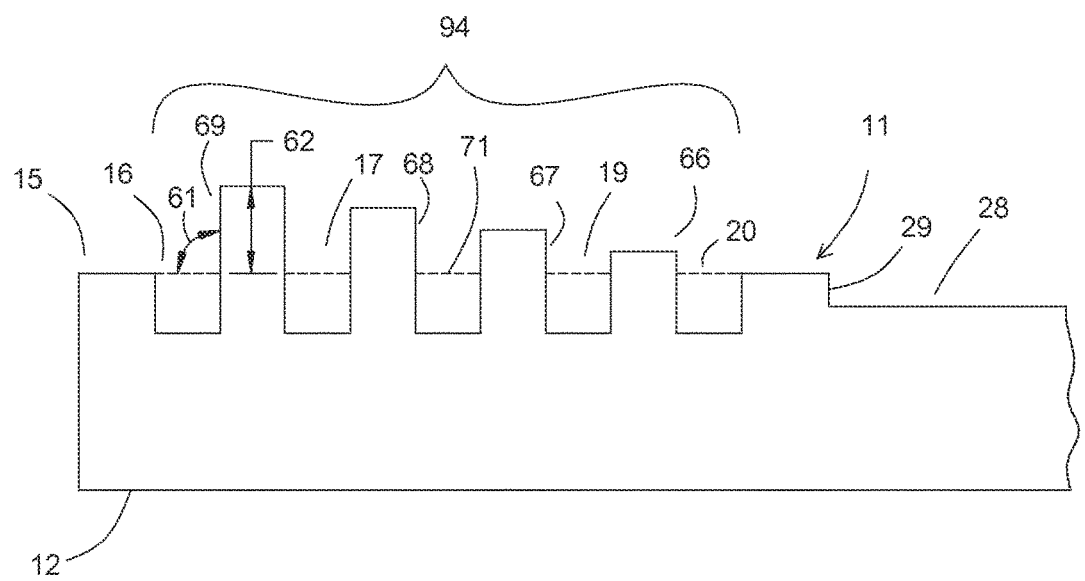
FIG. 7 illustrated a reduced cross-sectional view of an example of a portion an embodiment of another susceptor that is an alternate embodiment of the susceptor of FIG. 3 in accordance with the present invention.

FIG. 7 illustrates a cross-sectional view of an example of a portion of an embodiment of a wafer susceptor 65 that is an alternate embodiment of susceptors 10, 45, and 55. Susceptor 65 is similar to susceptors 10, 45, and 55 except that susceptor 65 includes a flow control structure 94 that is an alternate embodiment of structures 91-93. Structure 94 is similar to structure 93 except that structure 94 has a plurality of protrusions 66-69. Protrusions 66-69 all extend distance 62 away from surface 11 wherein the value of distance 62 varies such as increasing with increasing distance from pocket 28. In other embodiments, distance 62, the number of recesses 16-20, and the number of protrusions 66-69 may vary as explained for protrusions 56-59 in the description of FIG. 6. As can be seen, structure 94 is formed to have a variable height.

Figure 8:
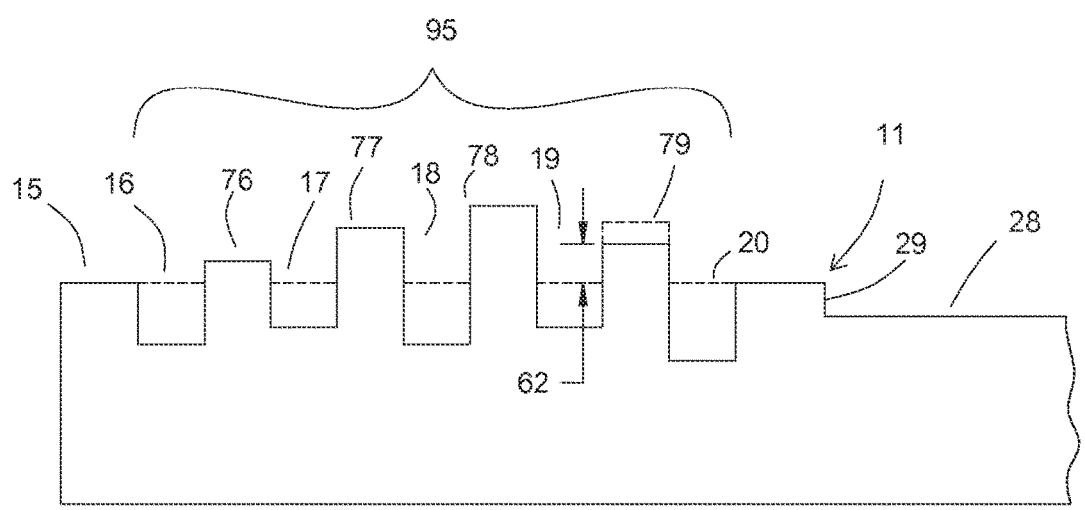
FIG. 8 illustrated a reduced cross-sectional view of an example of a portion an embodiment of another susceptor that is an alternate embodiment of the susceptor of FIG. 3 in accordance with the present invention.

FIG. 8 illustrates a cross-sectional view of an example of an embodiment of a wafer susceptor 75 which includes a flow control structure 95 that is an alternate embodiment of structures 91-94. Structure 95 includes protrusions 76-79 that are similar to protrusions 66-69 and/or protrusions 56-59. Distance 62 for any one of protrusions 76-79 may be greater than or less than that value for an adjacent one of protrusions 76-79, such as illustrated by the height of distance 62 of protrusion 79 versus the height of distance 62 of protrusion 78. In other embodiments, distance 62, the number of recess 16-20, and the number of protrusions 66-69 may vary as explained for protrusions 56-59 in the description of FIG. 6. As can be seen, structure 6595 is formed to have a variable height.

Figure 9:
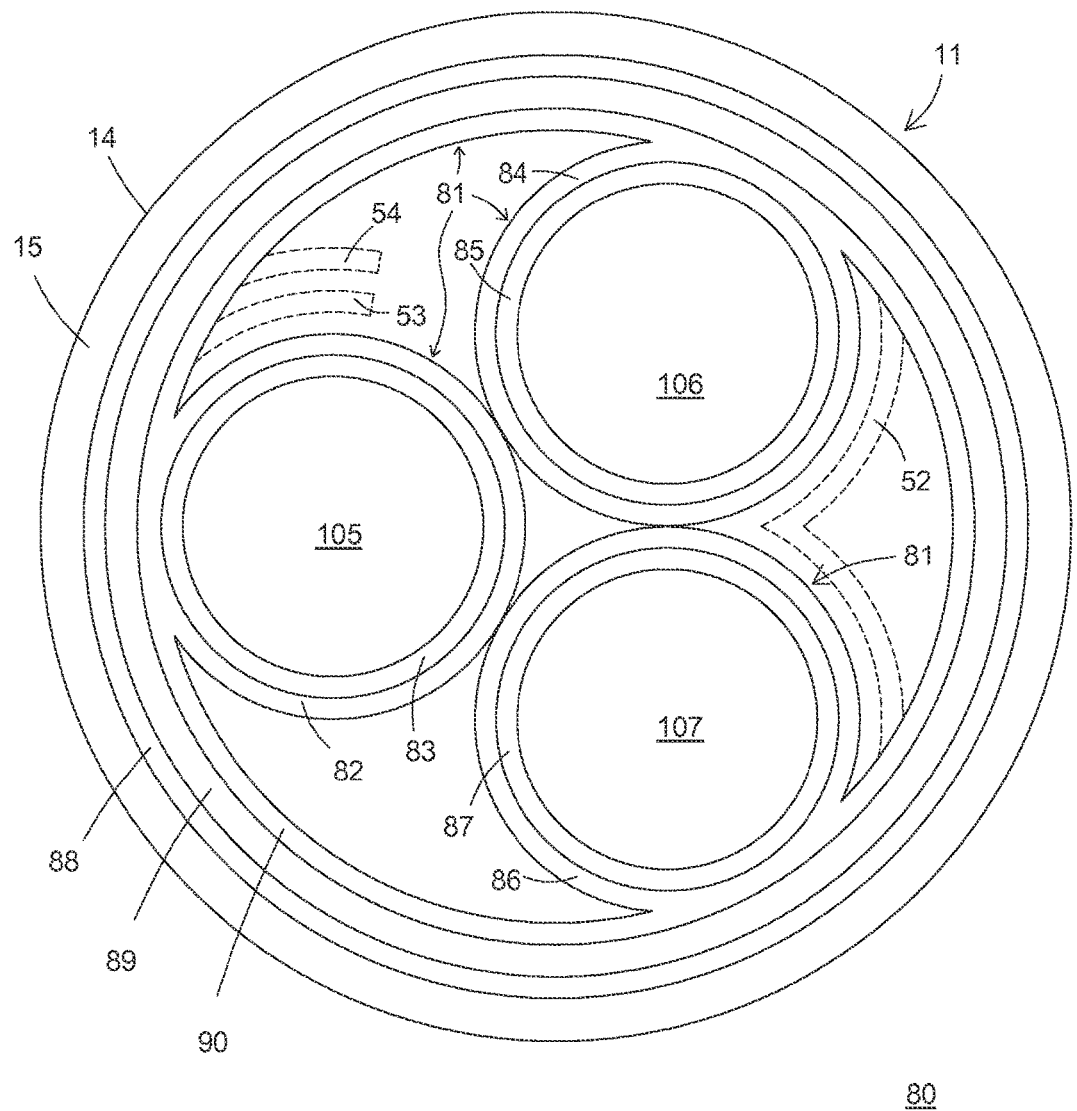
FIG. 9 illustrates a reduced plan view of an example of a portion of an embodiment of a susceptor that is an alternate embodiment of the susceptor of FIG. 3 in accordance with the present invention.

FIG. 9 illustrates a reduced plan view of an example of a portion of an embodiment of a wafer susceptor 80 that is an alternate embodiment of any of susceptors 10, 45, 55, 65, and/or 75. Susceptor 80 is similar to susceptors 10, 45, 55, 65, and/or 75 except that susceptor 80 includes a flow control structure 81 and a plurality of wafer pockets 105-107. Structure 81 is identified in a general manner by a plurality of arrows. Each of pockets 105-107 is configured to accept a semiconductor wafer such as wafer 40 (FIG. 4).

Structure 81 includes flow control elements 82-90. The topography of structure 81 is may be similar to any of structures 91-95. Flow control elements 82-90 may be any of the flow control elements described for flow control structures 91-95, including any mixture of recesses 16-20, spaces 21-25, and/or protrusions 56-59, 62-66, and 76-79. In other embodiments, any of elements 82-90 may be omitted as long as susceptor 80 has at least one of elements 82-90. In one non-limiting example embodiment, elements 88, 90, 82, 84, and 86 are recesses, element 89 is a space, and elements 83, 85, and 87 are ledges similar to ledge 25.

The topography of structure 81 is formed to have at least a portion of a flow control element positioned between one of pockets 105-107 and outer edge 14 of susceptor 80. For example, all of element 82 is between pocket 105 and edge 14. Similarly, all of elements 84 and 86 are between respective pockets 106 and 107 and edge 14. In some embodiments, each wafer pocket has at least one flow control element surrounding all edges of the wafer pocket. In some embodiments some of elements 82-90 may intersect as illustrated by element 90 intersecting elements 82, 84, and 86. In other embodiments, none or some of elements 82-90 may intersect. In another embodiment, any one of or all of elements 88 and/or 90 may be omitted.

Those skilled in the art will understand that the flow control structure nay have various other shapes as long as the flow control structure is between the edge of the wafer pocket, such as edge 29, and the outer edge, such as edge 14, of the wafer susceptor. For example, an alternate embodiment of structure 81 may have flow control element(s) 52 that are formed to dip in-between pockets 106 and 107 but that do not necessarily have to completely encircle pockets 106 and/or 107. Element 52 may be a recess or a protrusion or both or a plurality of either or both. Although only one element 52 is shown in FIG. 9, the flow control structure may include other similar elements positioned between pockets 105 and 106, and/or between pockets 105 and 107.

Another alternate shape for the flow control elements is illustrated by a flow control elements 53 and 54. Elements 53 and 54 are formed in the shape of chevrons that positioned to intercept the gas flow toward pocket 105. For example, the flow control elements may be formed as partial recesses or protrusions that are positioned toward the leading edge of the gas flow in the direction of the rotation of the susceptor. In another example, the chevrons may be positioned substantially perpendicular the gas flow or at some other angle relative to the gas flow as long as the angle results in increasing the area of the susceptor in the gas flow path. Although only two chevrons are shown in FIG. 9, the flow control structure may include other similar elements positioned between pockets 105 and 106, and/or between pockets 106 and 107.

It will be appreciated by those skilled in the art, that in one embodiment, a susceptor for processing a semiconductor wafer may comprise, a first surface of the susceptor, for example a surface 11; a second surface of the susceptor opposite the first surface; an outer radius of the susceptor, for example a radius 27; an outside edge of the susceptor;

a wafer pocket, for example a wafer pocket 28 formed as a recess in the first surface and extending toward the second surface, the wafer pocket having a pocket radius, such as a radius 26 for example, that is less than the outer radius and having an outer edge; and a flow control structure, such as structure 91 or any of structures 92-95 or alternates thereof, positioned on a portion of the first surface between the outside edge of the susceptor and the outer edge of the wafer pocket.

In another embodiment, the susceptor may include a plurality of recesses, for example any one of recesses 16-20, formed in the first surface of the susceptor and extending into the susceptor.

Another embodiment of the susceptor may also include that the plurality of recesses include a first recess spaced a first distance, for example any of distances 34 or 39 and alternates thereof, from a second recess wherein a portion of the first surface, such as any of spaces 21-24, is between the first and second recesses.

A further embodiment of the susceptor may include that the flow control structure includes one of a recess extending from the first surface into the susceptor or a protrusion, such as any of protrusions 56-59, 66-69, and 76-79 and alternatives thereof, extending away from the first surface at a first angle.

Other embodiments of the susceptor may include that the flow control structure includes a plurality of protrusions including a first protrusion and a second protrusion wherein a portion of the first surface, such as any of the portions that include spaces 21-24, is between the first and second protrusions.

In another embodiment the first protrusion may have a greater height, such as distance 62, from the first surface than the second protrusion.

The susceptor may have another embodiment wherein a height of the plurality of protrusions from the first surface increases with one of increasing distance from the outer edge, such as from edge 29, of the wafer pocket or decreasing distance from the outer edge of the wafer pocket.

Another embodiment of the susceptor may include that the flow control structure includes at least one recess and at least one protrusion.

In yet another embodiment, the susceptor the flow control structure of the susceptor may include a plurality of protrusions having a variable height.

Those skilled in the art will also appreciate that a method of forming a susceptor for processing a semiconductor wafer may comprise: providing a susceptor having a first surface (for example surface 11), a second surface opposite the first surface wherein the susceptor has an outer radius (such as radius 27 for example), and an outside edge (such as edge 14 for example); the susceptor also having a wafer pocket formed as a recess in the first surface and extending toward the second surface, the wafer pocket having a pocket radius (for example radius 26) that is less than the outer radius and having an outer edge (for example edge 29); and forming a non-uniform surface on at least a portion of the first surface that is positioned between the outside edge of the susceptor and the outer edge of the wafer pocket (for example the portion of surface 11 that is between edge 29 and edge 14).

Another embodiment of the method may include one of a recess extending from the first surface into the susceptor, for example any one of recesses 16-20, or a protrusion, such as any one of protrusions 56-59, 66-69, and 76-79 for example, extending away from the first surface at a first angle.

Another embodiment of the method may include forming a plurality of recesses extending into the susceptor and spaced a first distance apart from each other.

The method may also include another embodiment including forming a plurality of protrusions extending away from the first surface and spaced a first distance apart from each other.

In another embodiment, the method may also include providing a susceptor having a plurality of wafer pockets, and wherein forming a non-uniform surface includes forming the non-uniform surface between each of the plurality of wafer pockets and the outside edge of the susceptor.

Other embodiments of the method may include forming the non-uniform surface around all edges, such as edges 29, of each wafer pocket.

Another embodiment of the method may include forming at least one recess extending into the susceptor and at least one protrusion extending away from the first surface.

In another embodiment, the method may include forming a plurality of protrusions having a variable height.

The method may have another embodiment that includes forming at least one protrusion of the plurality of protrusions to have a height that is greater than a height of another protrusion of the plurality of protrusions.

In view of all of the above, it is evident that a novel device and method is disclosed. Included, among other features, is forming a wafer susceptor to have non-uniform surface and/or a non-planar surface for a portion of the susceptor that is between a wafer pocket of the susceptor and an outside edge of the susceptor. In one embodiment, the non-uniform surface may be a non-planar surface. In another embodiment, the non-uniform surface may be comprised of recesses in the surface or protrusions extending away from the surface or a combination of both.

While the subject matter of the descriptions are described with specific preferred embodiments and example embodiments, the foregoing drawings and descriptions thereof depict only typical and example embodiments of the subject matter and are not therefore to be considered to be limiting of its scope, it is evident that many alternatives and variations will be apparent to those skilled in the art. As will be appreciated by those skilled in the art, the example forms of the susceptors are used as a vehicle to explain the non-uniform surface and/or the non-planar surface of the susceptor. The susceptor may be configured with various other embodiments in addition to the embodiments illustrated in FIGS. 3-9 as long as the flow control structure changes the gas flow dynamics near the outer portions of a semiconductor wafer that may be placed in the susceptor.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A susceptor for processing a semiconductor wafer comprising:
    a first surface of the susceptor;
    a second surface of the susceptor opposite the first surface;
    an outer radius of the susceptor;
    an outside edge of the susceptor;
    a wafer pocket having a wafer recess in the first surface and extending toward the second surface, the wafer pocket having a pocket radius that is less than the outer radius and having an outer edge, the wafer pocket formed to contain a semiconductor wafer within the wafer pocket wherein the pocket radius is greater than a radius of the semiconductor wafer; and
    a gas diffusion flow control structure formed in a portion of the first surface between the outside edge of the susceptor and the outer edge of the wafer pocket such that the semiconductor wafer is within the wafer pocket and the gas diffusion flow control structure is external to the wafer pocket wherein the flow control structure includes one of a plurality of recesses extending from the first surface into the susceptor or a protrusion portion of the first surface extending away from the first surface at a first angle or a plurality of portions of the first surface extending away from the first surface at the first angle, the gas diffusion flow control structure forms a first a reaction rate between a gas and at least a portion of the semiconductor wafer adjacent to the edge of the wafer pocket wherein the first reaction rate is less than a reaction rate between the gas and an interior portion of the wafer.

2. The susceptor of claim 1 wherein the gas diffusion flow control structure includes the plurality of recesses formed in the first surface of the susceptor and extending into the susceptor.

3. The susceptor of claim 2 wherein the plurality of recesses includes a first recess spaced a first distance from a second recess wherein a portion of the first surface is between the first and second recesses.

4. The susceptor of claim 3 wherein the first distance is approximately 0.1 to 1.0 millimeters.

5. The susceptor of claim 2 wherein one recess of the plurality of recess has a depth of approximately one to five millimeters into the susceptor.

6. The susceptor of claim 1 wherein the gas diffusion flow control structure includes the plurality of protrusions including a first protrusion and a second protrusion wherein a portion of the first surface is between the first and second protrusions.

7. The susceptor of claim 6 wherein the first protrusion has a greater height from the first surface than the second protrusion.

8. The susceptor of claim 6 wherein a height of the plurality of protrusions from the first surface increases with one of increasing distance from the outer edge of the wafer pocket or decreasing distance from the outer edge of the wafer pocket.

9. The susceptor of claim 1 wherein the gas diffusion flow control structure includes at least one recess and at least one protrusion.

10. The susceptor of claim 1 wherein the gas diffusion flow control structure includes the plurality of protrusions having a variable height.

11. The susceptor of claim 1 wherein the gas diffusion flow control structure is configured to modify local gas flow dynamics of gas flow across the portion of the first surface between the outside edge of the susceptor and the outer edge of the wafer pocket.

12. The susceptor of claim 1 further including a first ledge external to the wafer pocket and positioned between the outside edge of the susceptor and the gas diffusion flow control structure and a second ledge external to the wafer pocket and positioned between the gas diffusion flow control structure and the outer edge of the wafer pocket wherein the first and second ledges each have a top surface that is substantially coplanar to the first surface.

13. The susceptor of claim 1 wherein the gas diffusion flow control structure forms a first a reaction rate between a gas and at least a portion of the semiconductor wafer includes the gas diffusion flow control structure forms a first a reaction rate between a gas and at least a portion of a top surface of the semiconductor wafer, wherein the top surface is a surface that faces away from the susceptor.

14. The susceptor of claim 1 wherein such that the semiconductor wafer is within the wafer pocket and the gas diffusion flow control structure is external to the wafer pocket includes the semiconductor wafer does not rest on or overlie the gas diffusion flow control structure.

15. A susceptor for processing a semiconductor wafer comprising:
    a first surface of the susceptor;
    a second surface of the susceptor opposite the first surface;
    an outer radius of the susceptor;
    an outside edge of the susceptor;
    a wafer pocket having a wafer recess in the first surface and extending toward the second surface, the wafer pocket having a pocket radius that is less than the outer radius and having an outer edge, the wafer pocket formed to contain a semiconductor wafer within the wafer pocket wherein the pocket radius is greater than a radius of the semiconductor wafer;

a gas diffusion flow control structure formed in a portion of the first surface between the outside edge of the susceptor and the outer edge of the wafer pocket such that the semiconductor wafer is positioned entirely within the wafer pocket and the gas diffusion flow control structure is external to the wafer pocket, the gas diffusion flow control structure having an inner edge proximal to the outer radius of the wafer pocket wherein the flow control structure includes one of a plurality of recesses extending from the first surface into the susceptor or a protrusion portion of the first surface extending away from the first surface at a first angle or a plurality of portions of the first surface extending away from the first surface at the first angle; and a ledge disposed between the wafer pocket and the inner edge of the gas diffusion flow control structure wherein the ledge is a portion of the first surface that extends between the gas diffusion flow control structure and an outer edge of the wafer pocket.

16. The susceptor of claim 15 wherein the ledge has a width that is no less than a width of a recesses of the plurality of recesses or a width of a protrusion of the plurality of protrusions.

* * * * *